US011608882B2

(12) United States Patent
Pollara, Jr. et al.

(10) Patent No.: US 11,608,882 B2
(45) Date of Patent: Mar. 21, 2023

(54) WATER COOLED PLANETARY SYSTEM

(71) Applicant: VACUUM TECHNOLOGY ASSOCIATES INC, Hingham, MA (US)

(72) Inventors: Robert A. Pollara, Jr., Halifax, MA (US); Ramya Chandrasekaran, Acton, MA (US); Thomas Foley, Duxbury, MA (US)

(73) Assignee: Vacuum Technology Associates Inc., Hingham, MA (US)

( * ) Notice: Subject to any disclaimer, the term of this patent is extended or adjusted under 35 U.S.C. 154(b) by 0 days.

(21) Appl. No.: 17/475,805

(22) Filed: Sep. 15, 2021

(65) Prior Publication Data

US 2022/0082165 A1 Mar. 17, 2022

Related U.S. Application Data

(60) Provisional application No. 63/078,422, filed on Sep. 15, 2020.

(51) Int. Cl.
*F16H 57/04* (2010.01)
*F16H 1/32* (2006.01)

(52) U.S. Cl.
CPC ........... *F16H 57/0412* (2013.01); *F16H 1/32* (2013.01); *F16H 57/0479* (2013.01)

(58) Field of Classification Search
CPC .... F16H 57/0412; F16H 1/32; F16H 57/0479; C23C 14/505; C23C 14/541
USPC .......................................................... 475/11
See application file for complete search history.

(56) References Cited

U.S. PATENT DOCUMENTS 4,087,239 A * 5/1978 Cline ...................... C30B 13/32 165/47
5,567,056 A * 10/1996 Blase .................. F16C 33/1055 384/380
8,167,756 B2 * 5/2012 Nishida ............... F16H 57/0482 475/159
8,360,186 B2 * 1/2013 Yamamoto .......... F16H 57/0412 74/606 A
8,562,472 B2 * 10/2013 Shinohara ............ B60K 17/046 475/159

FOREIGN PATENT DOCUMENTS

CN 108953577 A * 12/2018 ......... F16H 57/0412
CN 209395334 U * 9/2019
DE 4444537 A1 * 6/1996 ............... F16H 1/28
DE 10119148 A1 * 10/2002 .......... G01M 13/026
DE 60314087 T2 * 1/2008 ........... C23C 14/541
DE 102018111419 A1 * 11/2019
EP 3477158 A1 * 5/2019
JP 2006169590 A * 6/2006

* cited by examiner

*Primary Examiner* — Sherry L Estremsky
(74) *Attorney, Agent, or Firm* — Troutman Pepper Hamilton Sanders LLP

(57) ABSTRACT

The disclosed technology includes a water cooled planetary system comprising a planetary gearing system and a cooling assembly integrated into the planetary gearing system. The cooling assembly further comprises a stationary shaft, a main rotary union housed within the stationary shaft and a coolant tubing disposed on the main rotary union configured to deliver a coolant.

4 Claims, 5 Drawing Sheets

31
1
11
17
12
3
4
18
5
8
6

WATER COOLED PLANETARY SYSTEM

This application claims the benefit of U.S. Provisional Patent Application Ser. No. 63/078,422, filed Sep. 15, 2020, which is hereby incorporated by reference in its entirety.

FIELD OF THE INVENTION

The present invention relates to physical vapor deposition technology; more particularly, to the cooling mechanism of a planetary type multi-substrate rotation system.

BACKGROUND

A physical vapor deposition system is comprised of a vacuum chamber, vacuum pumps, substrate holder and deposition sources. The deposition source depends on the type of deposition including but not limited to magnetron sputtering, thermal evaporation, electron beam evaporation and so on. The substrate holder can be single rotation or planetary rotation.

Single rotation substrate holders rotate around a main axis. In planetary rotation, the planetary fixturing adds a second axis of substrate (planet) rotation, in addition to the main (sun) rotation. Individual rotating planets orbit around the main rotational axis. The ratio of the gearing (sun and planet) is chosen such that it generates a rotational motion that allows many orbits before a specific location on substrate retraces its path. The non-repeating nature of this rotational motion leads to film thickness uniformities better than 1%. These single and multi-planet rotation systems are well known substrate holding systems in many PVD systems.

One of the technical problems associated with the existing techniques is that the throughput of most deposition systems is often compromised due to limitations on the substrate temperature. The heat of condensation of the evaporant and the radiate heat from the deposition source during the coating process can easily elevate the substrate temperature during the coating process. In addition, material utilization in any deposition process is most effectively optimized with proper fixturing that can capture the maximum amount of the flux. One way to accomplish this is to have the substrates as close as possible to the vaporization source. However, this also increases the substrate temperature. The temperature can have detrimental effects on certain substrates. Substrates with low temperature tolerance and can melt or deform under elevated temperatures. Elevated temperatures can increase outgassing of the certain substrates affecting the coating process and film properties. Maintaining stable substrate temperature also plays a significant role in film properties such as stress, microstructure, optical and electrical properties. It is especially critical and challenging for thick films and multi-stacks.

Conventional planetary substrate holders are not cooled. The temperature of the substrate is monitored and controlled with process parameters; often comprising the throughput and material utilization of the system.

SUMMARY

This technology provides a number of advantages including providing a cooling mechanism of a planetary type multi-substrate rotation system. The water cooled planetary gearing system includes a planetary gearing system and a cooling assembly integrated into the planetary gearing system, the cooling assembly comprising a stationary shaft, a main rotary union housed within the stationary shaft and a coolant tubing disposed on the main rotary union configured to deliver a coolant.

An embodiment of the disclosed technology includes a planet rotary unions connected to the coolant tubing configured to deliver the coolant.

Additionally, the embodiment of the disclosed technology includes the coolant that is delivered to a substrate cooling jacket.

Furthermore, the embodiment of the system includes the coolant tubing is connected to a planet rotary union in a parallel circuit to enable uniform cooling.

Additionally, in the embodiment of the disclosed technology a differential pressure assembly housed inside the cooling assembly, wherein the differential pressure assembly is configured to track a pressure difference.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION

Figure 1:
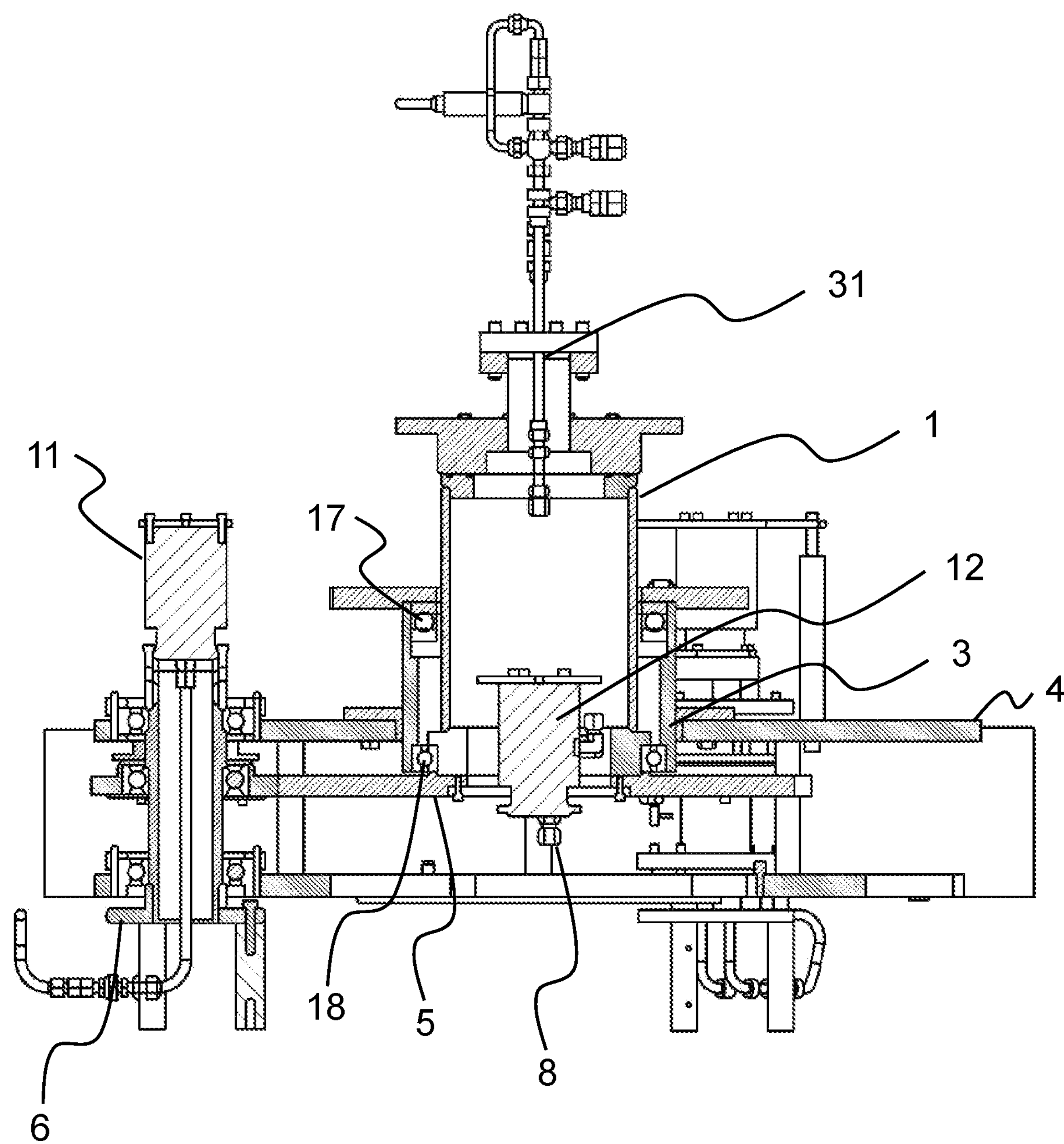
FIG. 1 is an example of the water cooled planetary system.
Figure 3A:
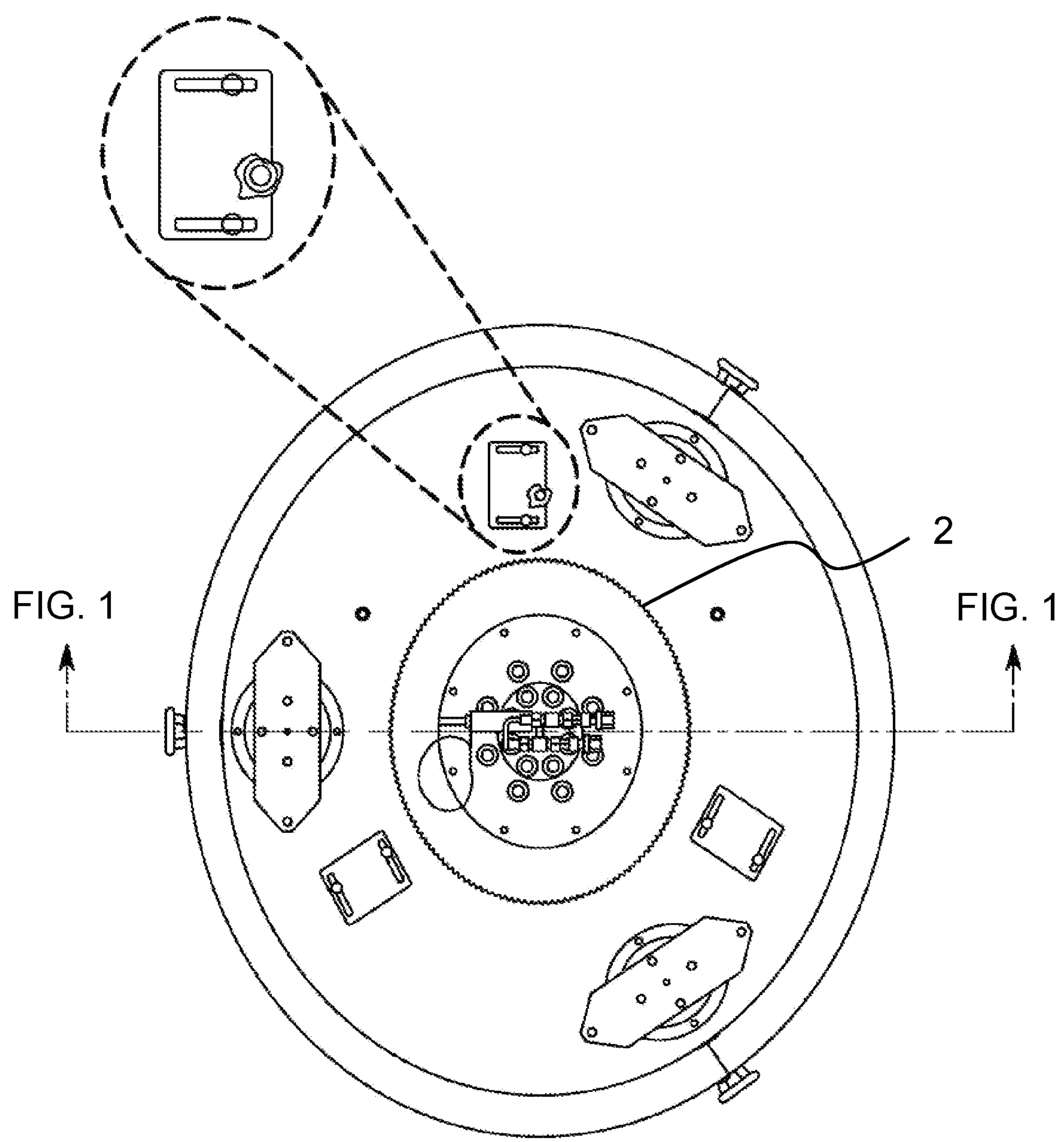
FIG. 3A is an example of the water cooled planetary system.
Figure 3B:
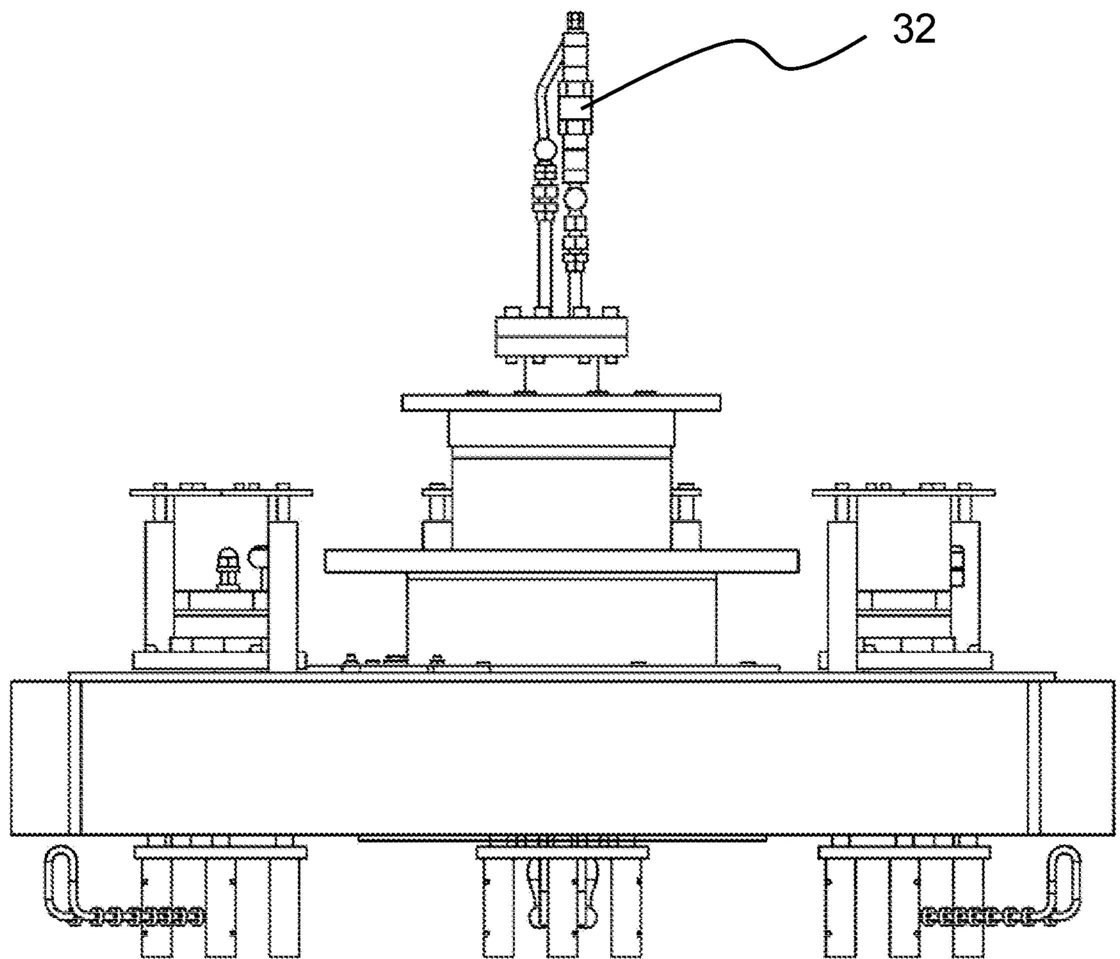
FIG. 3B is an example of the water cooled planetary system.

The disclosed technology relates to substrate holder where single or multiple substrates held and rotated at various angles can be cooled by water or similar fluid to achieve lower substrate temperatures. The coolant assembly system enables coolant (liquid) from an external chiller to flow to the individual substrate cooling jackets mounted onto the planets. This system can be used to cool one or multiple planet substrates. An exemplary water cooled planetary system is illustrated in FIGS. 1 and 3. Stationary shaft 1 houses the coolant tubing 31 and the main rotary union 12. The tubing 8 from the main rotary union 12 is connected the planet rotary unions 11 from which the coolant is delivered to the substrate cooling jacket. The coolant lines from the main rotary union are connected to the planet rotary union in a parallel circuit enabling uniform cooling to all the planets. The differential pressure switch and flow switch assembly 32 helps to measure and track any pressure or flow difference in the fluid flow between the different planets and identify any mechanical blockage within the coolant assembly system. When the pressure and flow difference is observed, the disclosed technology displays a warning message indicating the difference in the pressure. This cooling assembly is integrated into a standard planetary gearing system to enable proper rotation of the planets 6.

The stationary inner hub 1 is enclosed within the main hub 3 of a typical multi-planet rotational system. The main hub is mounted in the top of the chamber and serves as a standard interface for various types of fixture rotation. The hub provides a single axis of rotation. The hub assembly consists of two bearings thrust bearing 17 at the top and a radial bearing 18 at the bottom of the hub 111811. The bearing sets assist in preventing friction between, and resulting wear of, within the main rotation system. This hub is gear driven, using wide-faced gear sets. The drive system for the hub consists of an externally mounted DC gear motor controlled by programmable electronic controllers with acceleration/deceleration ramps. It is coupled through the chamber by a ferrofluidic type feedthrough that drives an off-axis pinion gear. The pinion engages a drive gear 2 that is mounted to the hub. To facilitate quick loading and unloading, the drive transmission assembly has an over-running clutch that allows the tooling fixtures to be rotated by hand.

The Orbiter plate 4 mounted to the hub has multiple planet mounting holes. This enables the rotation of the planet assemblies which includes the planet shaft and planet rotary unions 11 that carries the fluid from the main rotary union 12. Two bearings sets (bearing nut and bearing retainers) mount the planet shaft to the orbiter plate and the stabilizer plate. The stabilizer plate mainly helps for the mechanical stability of the system and to mount planetary shielding.

The bearing sets assist in preventing friction between, and resulting wear of, within the planet rotation system. The sun gear 5 that is mounted to the bottom of the stationary shaft/inner hub 1 drives the planet gears 7. The gear ratios are selected such that individual rotating planets orbiting around the central rotation axis will pass at a different radial position. The non-repeating nature of this rotation scheme leads to film thickness uniformities often better than 1%.

Figure 2A:
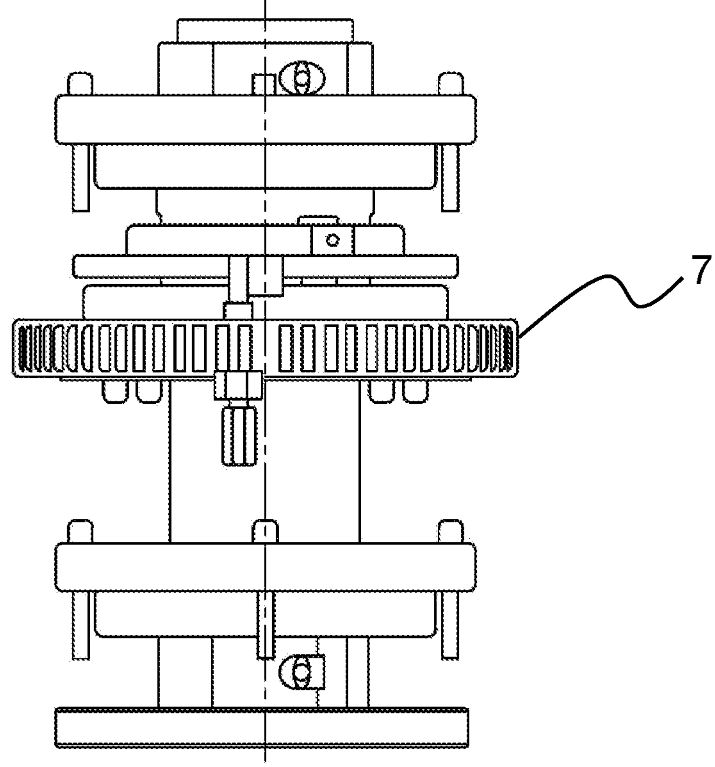
FIG. 2A is an example of the water cooled planetary system.
Figure 2B:
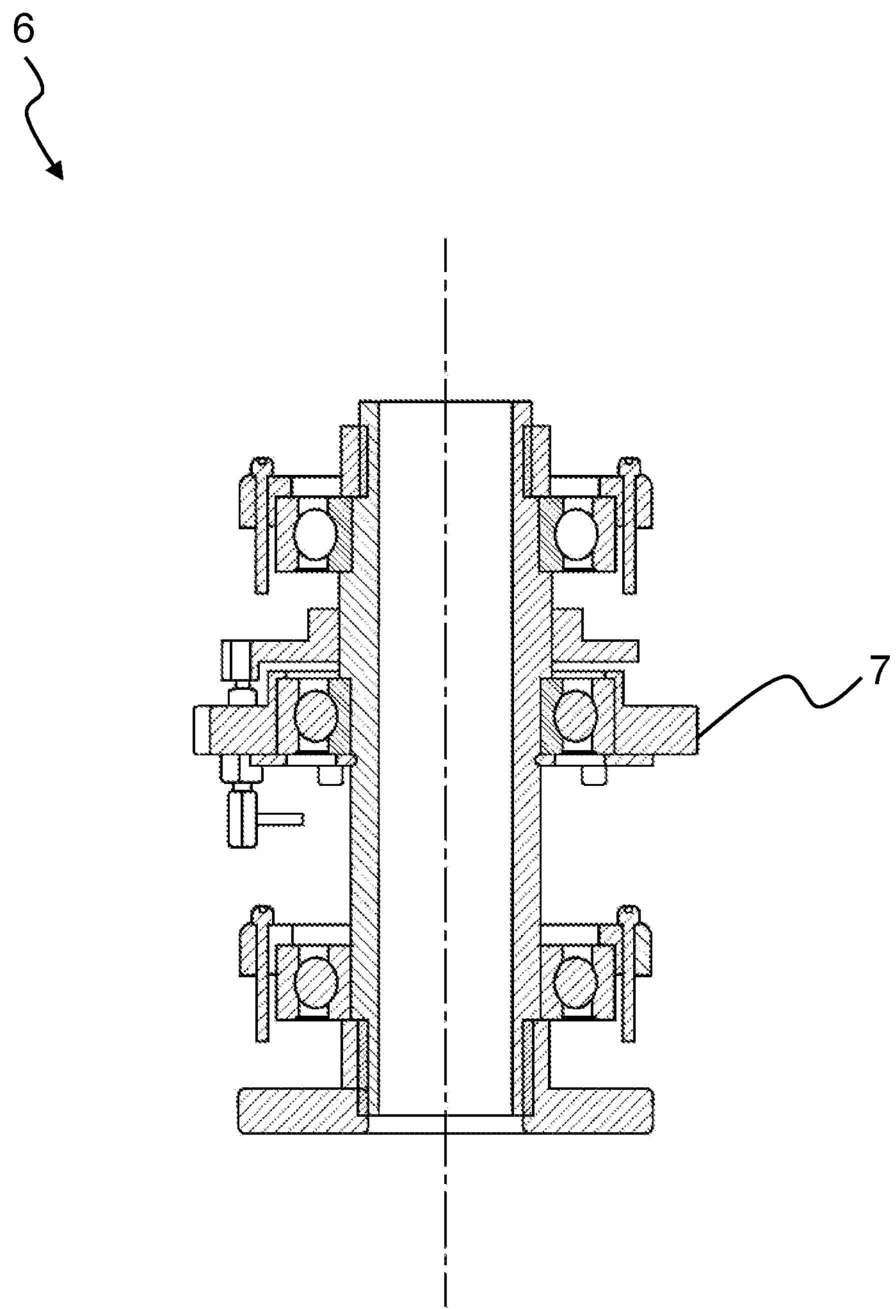
FIG. 2B is an example of the water cooled planetary system.

FIG. 2 provides an exemplary water cooled single planetary system 6. The coolant assembly system is independent of the planetary rotation system and can be integrated to any type of planetary rotation including dome, variable angle planetary rotation systems, etc. Depending on the substrate shape and size, they can be cooled by flowing coolant directly into the substrate or the substrates can be mounted onto the surface of the cooling jacket and can be cooled by the surface contact.

The disclosed technology can be applied to any of existing single or planetary rotation systems including single rotation substrate holders that are dome shaped or flat disc that can hold one or multiple substrates; planetary rotation substrate holders that are dome shaped or flat disc that can hold one or multiple substrates; substrates mounted on single or planetary rotation that are held parallel to the surface of the source or tilted, where the substrates are set at an angle with respect to the source; three dimensional substrates with cooling fluid channels built within it.

The disclosed technology also focuses on the ease of loading and unloading substrates, eliminating accidental fluid spill in the vacuum chamber during the load/unload process. The use of quick fitting with self-sealing valve allows the fluid to be retain within the transfer lines during the unloading sequence. The cooling fluid is closed looped to an independent chiller. The reliability of the cooling mechanism is preserved using a supervisory control system that completely automates its operation. Input and output fluid temperature is monitored and the data is captured and logged on set time intervals. For temperature sensitive process applications, interlocks can be set to terminate or pause the deposition process until the substrate cools down.

Having thus described the basic concept of the technology, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the technology. Additionally, the recited order of processing elements or sequences, or the use of numbers, letters, or other designations therefore, is not intended to limit the claimed processes to any order except as may be specified in the claims. Accordingly, the technology is limited only by the following claims and equivalents thereto.

What is claimed is:

1. A water cooled planetary system comprising:
- a planetary gearing system; and
- a cooling assembly integrated into the planetary gearing system, the cooling assembly comprising:
  - a stationary shaft;
  - a main rotary union housed within the stationary shaft;
  - a coolant tubing disposed on the main rotary union configured to deliver a coolant; and
  - a planet rotary union connected to the coolant tubing configured to deliver the coolant.

2. The system as set forth in claim 1 further comprising, a differential pressure assembly housed inside the cooling assembly, wherein the differential pressure assembly is configured to track a pressure difference in the coolant flow between a plurality of planets.

3. The system as set forth in claim 2 wherein the gear ratio of the planetary gearing system is configured to rotate the plurality of planets in a non-repeating configuration.

4. The system as set forth in claim 1 wherein the coolant is closed looped to an independent chiller.

* * * * *